United States Patent
Gill et al.

(10) Patent No.: US 7,961,440 B2
(45) Date of Patent: Jun. 14, 2011

(54) CURRENT PERPENDICULAR TO PLANE MAGNETORESISTIVE SENSOR WITH REDUCED READ GAP

(75) Inventors: Hardayal Singh Gill, Palo Alto, CA (US); Wipul Pemsiri Jayasekara, Los Gatos, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 929 days.

(21) Appl. No.: 11/863,131

(22) Filed: Sep. 27, 2007

(65) Prior Publication Data

US 2009/0086385 A1  Apr. 2, 2009

(51) Int. Cl.
 *G11B 5/39* (2006.01)
(52) U.S. Cl. .................................. 360/324.11
(58) Field of Classification Search ............. 360/324.11
 See application file for complete search history.

(56) References Cited

U.S. PATENT DOCUMENTS

| | | | |
|---|---|---|---|
| 5,898,547 A * | 4/1999 | Fontana et al. | 360/324.2 |
| 6,510,030 B1 | 1/2003 | Song et al. | 360/319 |
| 6,603,642 B1 | 8/2003 | Araki et al. | 360/324 |
| 6,680,827 B2 | 1/2004 | Li et al. | 360/314 |
| 6,721,139 B2 | 4/2004 | Gill | 360/321 |
| 6,738,234 B1 | 5/2004 | Araki et al. | 360/324 |
| 6,847,510 B2 * | 1/2005 | Childress et al. | 360/324.2 |
| 7,027,272 B2 | 4/2006 | Furukawa et al. | 360/324.12 |
| 7,092,221 B2 | 8/2006 | Gill | 360/324.11 |
| 7,130,162 B2 | 10/2006 | Seyama et al. | 360/322 |
| 7,215,516 B2 | 5/2007 | Yoshikawa et al. | 360/324.11 |
| 7,220,499 B2 | 5/2007 | Saito et al. | 428/811.5 |
| 7,522,392 B2 * | 4/2009 | Carey et al. | 360/324.2 |
| 2003/0123198 A1 | 7/2003 | Sugawara et al. | 360/314 |
| 2008/0094761 A1 * | 4/2008 | Freitag et al. | 360/324.12 |

FOREIGN PATENT DOCUMENTS

JP   2007012186   1/2007

* cited by examiner

*Primary Examiner* — Mark Blouin
(74) *Attorney, Agent, or Firm* — Zilka-Kotab, PC

(57) ABSTRACT

A magnetoresistive sensor having a greatly reduced read gap. The sensor has a pinned layer structure formed above the free layer. A layer of antiferromagnetic material (AFM layer) is formed over the pinned layer structure and has a front edge disposed toward, but recessed from the air bearing surface. An electrically conductive, magnetic lead is formed over the pinned layer and AFM layer such that the lead fills a space between the AFM layer and the air bearing surface. In this way, the read gap is distance between the outermost portion of the pinned layer structure and free layer. The thickness of the AFM layer and capping layer are not included in the read gap.

21 Claims, 13 Drawing Sheets

CURRENT PERPENDICULAR TO PLANE MAGNETORESISTIVE SENSOR WITH REDUCED READ GAP

FIELD OF THE INVENTION

The present invention relates to magnetoresistive sensors and more particularly to a sensor having a greatly reduced read gap thickness for improved data density.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to cos $\Theta$, where $\Theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

The need for ever increased data density is pushing researches to develop data recording systems that can read and record ever smaller bit lengths in order to increase the density of data recorded on a magnetic medium. This has led a push to decrease the gap size of a read head such as a GMR head. However, the amount by which such gap lengths can be decreased has been limited by physical limitations of sensors and also by the limitations of currently available manufacturing methods.

Therefore, there is a need for magnetoresistive sensor design and method of manufacture that can reduce the read gap of the sensor. Such a design must be manufacturable using currently available manufacturing methods and must not sacrifice sensor reliability and robustness.

SUMMARY OF THE INVENTION

The present invention provides a magnetoresistive sensor having a reduced read gap. The sensor includes a pinned layer structure with a layer of and ferromagnetic material (AFM layer) formed thereover. The layer of antiferromagnetic material has a front edge that is recessed from the air bearing surface. An electrically conductive, magnetic lead layer is formed over the AFM layer and the exposed portion of the pinned layer structure, such that the lead layer tills a space between the front edge of the AFM Saver and the air bearing surface.

A capping layer, such as Ta can be formed over the AFM layer and also terminates at the front edge of the AFM layer. Because the AFM layer and capping layer do not extend to the ABS, their thicknesses are not included in the read gap. Therefore, the thickness of the read gap can be greatly reduced.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
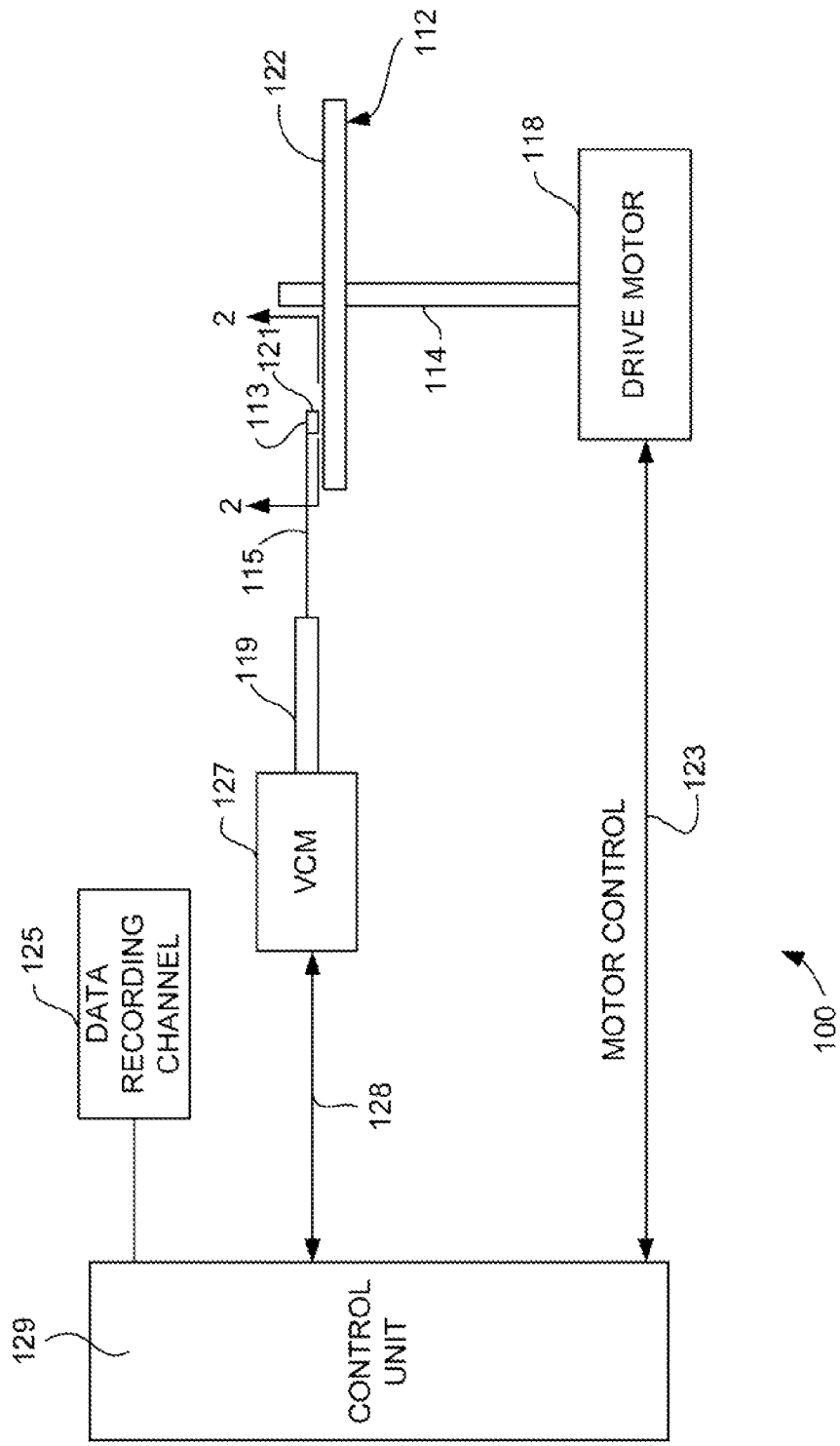
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 1.19 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
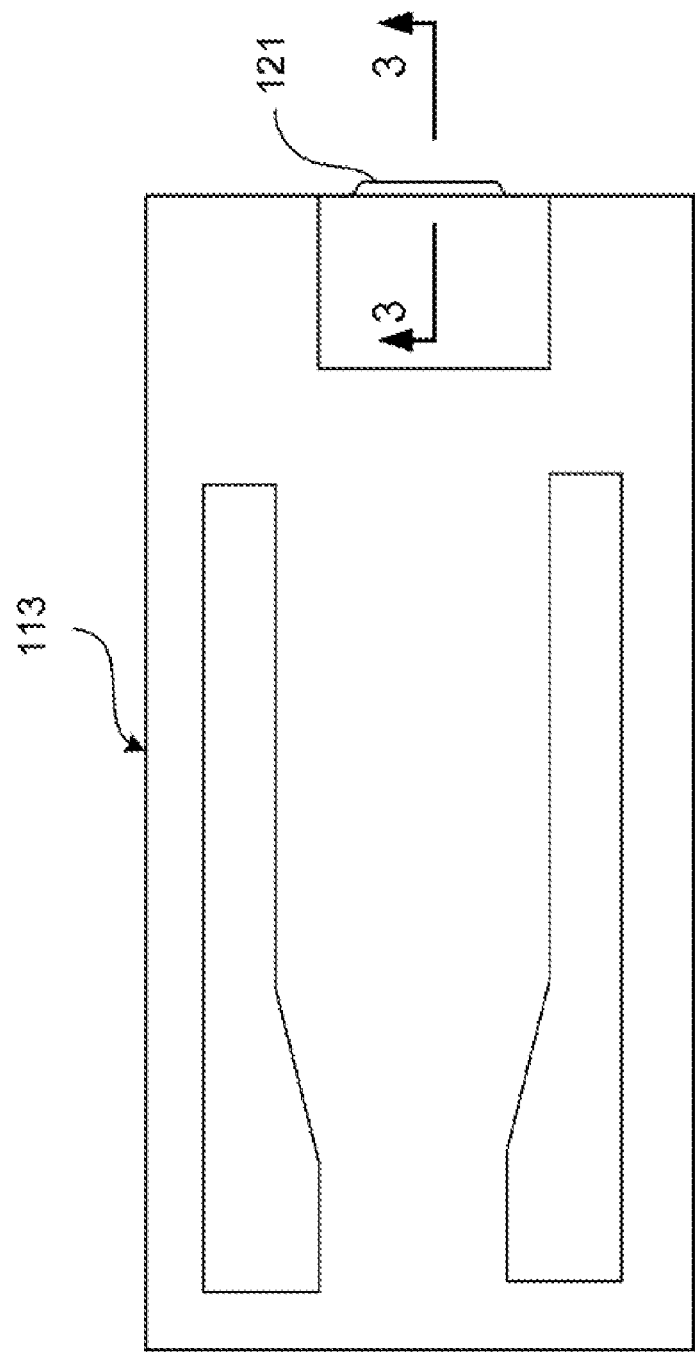
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
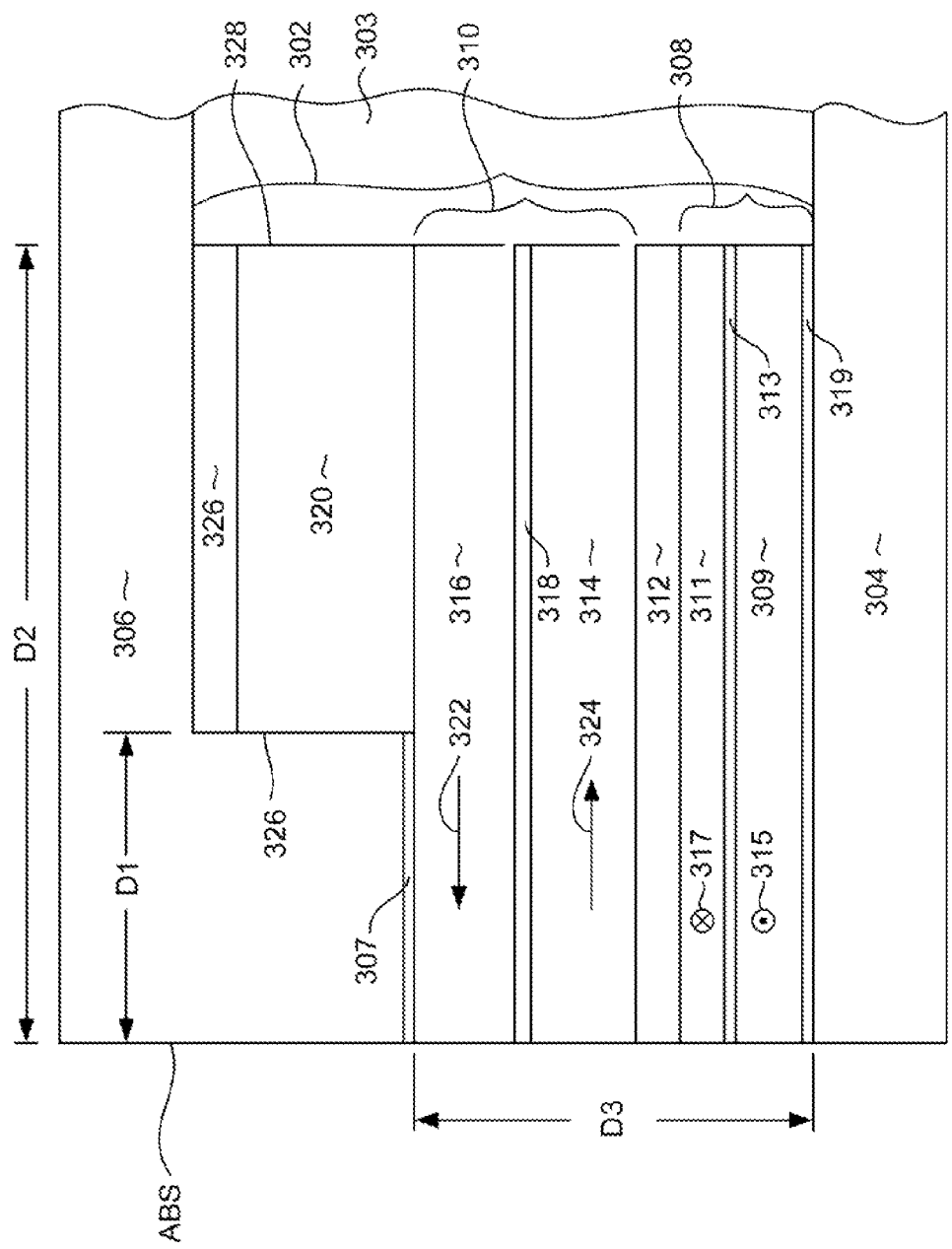
FIG. 3 is an enlarged cross sectional view taken from line 3-3 of FIG. 2 rotated 90 degrees counterclockwise.

With reference now to FIG. 3, a current perpendicular to plane magnetoresistive sensor 300 is shown in cross section as taken from line 3-3 of FIG. 2. The sensor 300 includes a sensor stack 302 sandwiched between first and second, electrically conductive leads 304, 306. The electrically conductive leads 304, 306 are preferably constructed of a magnetic material such as NiFe or CoFe so that they can function as magnetic shields as well as leads. A magnetic fill material 303 such as alumina fills the space behind the back edge of the sensor stack 302 between the first and second leads 304, 306.

The sensor stack 302 includes a magnetic free layer structure 308 and a pinned magnetic layer structure 310. A non-magnetic, electrically conductive spacer layer 312, constructed of a material such as Cu or CuOx is sandwiched between the free layer 308 and pinned layer structure 310. The sensor 300 could also be embodied in a tunnel valve sensor, in which case the layer 312 can be an electrically insulating barrier layer, such as MgO.

The pinned layer 310 is preferably an antiparallel pinned (AP Pinned) structure including first and second magnetic layers 314, 316 with a non-magnetic antiparallel coupling layer 318 sandwiched between the magnetic layers 314, 316. The magnetic layer 314 (closest to the non-magnetic layer 312) is preferably a Heusler alloy, such as Co2XY, where X can be Fe, Mn or Cr, and Y can be Al, Si or Ge. The other magnetic layer 316 can be constructed of CoFe having about 40-50 atomic percent Fe. The AP coupling layer 318 can be a material such as Ru and can have a thickness of about 4 Angstroms to ensure strong antiparallel coupling between the magnetic layers 314, 316.

The free layer structure 308 is also preferably an antiparallel coupled structure, having first and second magnetic layers 309, 311 separated by an antiparallel coupling layer 313, which can be Ru. The first and second magnetic layers 309, 311 have first and second magnetizations 315, 317 that are biased in a direction parallel with the ABS, but which are free to rotate in response to an external magnetic field. If the sensor is embodied in a current perpendicular to plane giant magnetoresistive sensor (CPP GMR), then the magnetic layer 311 (closest to the spacer layer 312) comprises a Heusler alloy such as Co2XY, where X is Fe, Mn or Cr and Y is Al, Si or Ge. The other magnetic layer 309 can be one or more layers of CoFe and or NiFe.

As mentioned above, the invention can be embodied in a tunnel valve sensor rather than a GMR sensor. In that case, the layer 314 can be an amorphous layer of CoFeB, and the layer 316 can be CoFe having about 40-50 atomic percent Fe. In a tunnel barrier layer, the layer 311 can be CoFe or CoFeB. If CoFe is used, there should be a layer of CoFB at adjacent to the barrier layer 312. The other layer 309 can be a Heusler alloy as listed above.

A seed layer 319 can be provided at the bottom of the sensor stack 302 to initiate a desired grain structure in the other layers of the sensor stack. The seed layer 319 can be constructed of materials such as a layer of Ta and a layer of Ru, or a layer of Ta and a layer of Cu.

As can be seen, the pinned layer structure 310 is formed above the free layer 308 (i.e. in a trailing direction relative to the data track (not shown). A portion of the second magnetic layer 316 is exchange coupled with a layer of antiferromagnetic material (AFM layer) 320 such as IrMn, which strongly pins the magnetization 322 of the second magnetic layer 316 in a first direction perpendicular to the air bearing surface (ABS). Antiparallel coupling between the first and second magnetic layers 314, 316 pins the magnetization of the first magnetic layer 314 in a second direction 324 that is antiparallel to the first direction 322. A capping layer 326, such as Ta, is formed over the AFM layer 320.

As can be seen, in FIG. 3, the AFM layer 320 is recessed from the ABS, having a front edge 328 that is recessed from the ABS by a distance D1. The capping layer 326 is also recessed by this same distance D1. The sensor stack 302 has a back edge 328 that is spaced from the ABS by a distance D2, which defines the stripe height of the sensor 300.

As can be seen, the second, or upper, lead/shield 306 extends over the capping layer and AFM layer 326, 320 and also over the exposed portion of the pinned layer structure 310, and fills the space between the ABS and the front edge 326 of the AFM layer 320. A thin exchange breaking layer 307 can be provided between the upper lead 306 and the pinned layer 316, however this is optional. If used, the exchange breaking layer 307 could be a layer of Ta having at thickness of about 5 Angstroms.

The first and second shield 304, 306 are separated by a distance D3 that defines the read gap of the sensor 300. As discussed above, it is desirable to make the read gap as small as possible in order to increase data density as much as possible. As those skilled in the art will recognize, in order to maintain effective exchange coupling between the magnetic layer 316 and the AFM layer 320, the AFM layer 320 must be very thick relative to the other layers of the sensor stack 302. Including this layer 320 as well as the capping layer 326 in the thickness of the total read gap would greatly increase the read gap of the sensor 300. However, the novel design of the present invention allows the AFM to be thick, enough, to effectively exchange couple with the magnetic layer, while advantageously not being included in the read gap thickness D3. By eliminating the thickness of the AFM layer 320 and capping layer 326 from the read gap thickness, the read gap thickness can be reduced by about 10 nm. This, results in a total read gap D3 of about 25 nm which, as can be seen, is a very large reduction in read gap.

As mentioned above, the AFM 320 and capping layer 326 are recessed from the ABS by a distance D1 and the sensor stack 302 has a stripe height D2, also measured from the ABS. It has been found that effective exchange coupling can be provided with an AFM layer 320 that covers about half of the magnetic layer 316. In order to provide effective exchange coupling and also maintain a small read gap D1 is preferably about ¼ to ½ D2.

Figure 4:
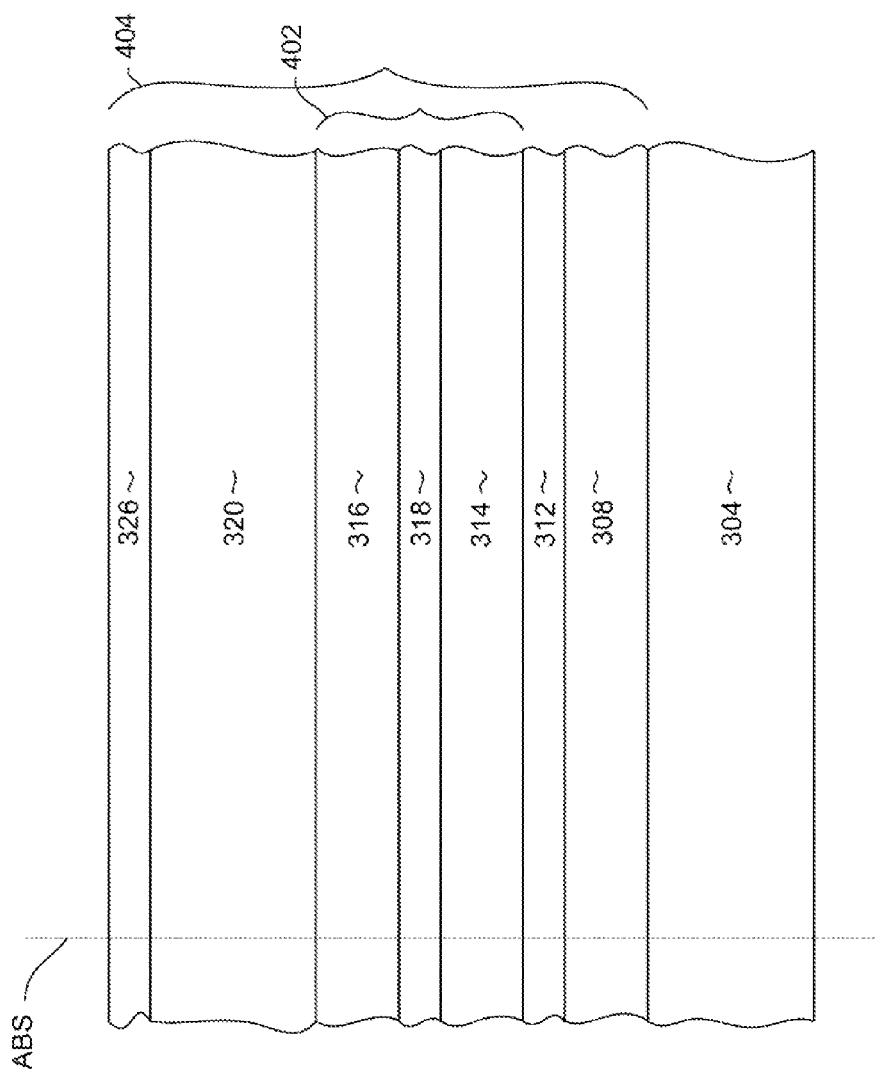
FIGS. 4-13 are views of a showing a sensor in various intermediate stages of manufacture in order to illustrate a method of manufacturing a magnetoresistive sensor according to an embodiment of the invention.

With reference now to FIGS. 4-13, a method for manufacturing a sensor according to an embodiment of the invention will be described. With particular reference to FIG. 4, a first lead is formed and a plurality of sensor layers 402 is deposited over the first lead 304. The sensor layers 402 can be deposited by sputter deposition in a sputter deposition tool, or could be deposited by some other method such as ion beam deposition. The sensor layers can include: a free layer 308, non-magnetic spacer layer 312, a first magnetic layer 314 of a pinned layer structure 310, an AP coupling layer 318, a second magnetic layer 316 of the pinned layer structure 310; an AFM layer such as IrMn or IrMnCr and a capping layer 326 such as Ta. Although the air bearing surface (ABS) has not been formed yet at this stage of manufacture, the intended location of an ABS plane is indicated by a dashed line denoted ABS.

Figure 5:
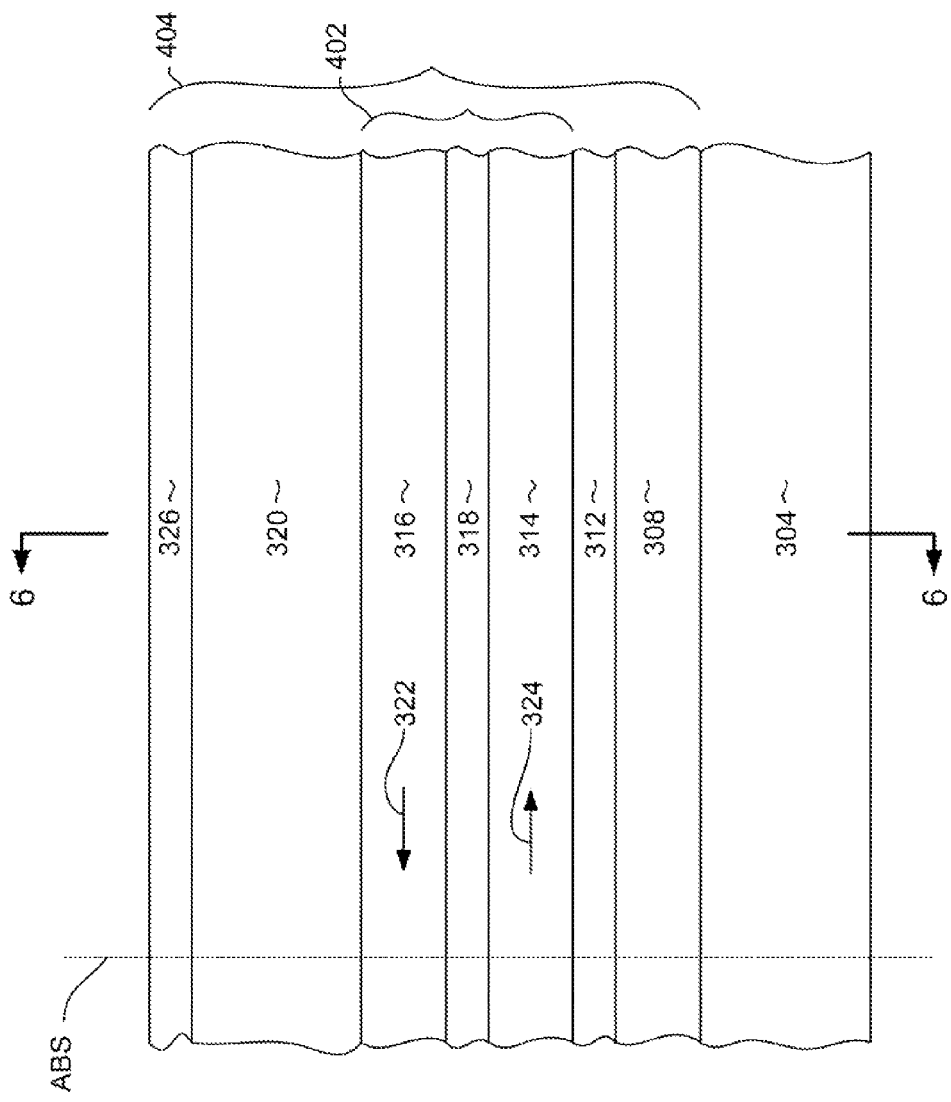

With reference now to FIG. 5, an annealing process is performed to pin the magnetizations 322, 324 of the magnetic layers 314, 316 of the pinned layer structure 310. The annealing process includes heating the deposited layers 308-326 to a temperature that is at or above the blocking temperature of the AFM layer 320. While this temperature is maintained, a strong magnetic field is applied in a direction parallel with the desired direction of magnetization 322 of the magnetic layer 316. This magnetic field should be strong enough to overcome the antiparallel coupling between the first and second magnetic layers 314, 316. While this magnetic field is maintained, the layers 304-326 are cooled back to room temperature. The magnetization 324 of the magnetic layer 316 will now be strongly pinned by the exchange coupling between the magnetic layer 316 and the AFM layer 320. Antiparallel coupling between the magnetic layers 314, 316 pins the magnetization 314 in a direction antiparallel to that 322 of the second magnetic layer 316. The capping layer 326 is necessary during this high temperature anneal to prevent the oxidation of the sensor layers 308, 326 as well as atom migration in these layers, which would otherwise destroy the sensor.

Figure 6:
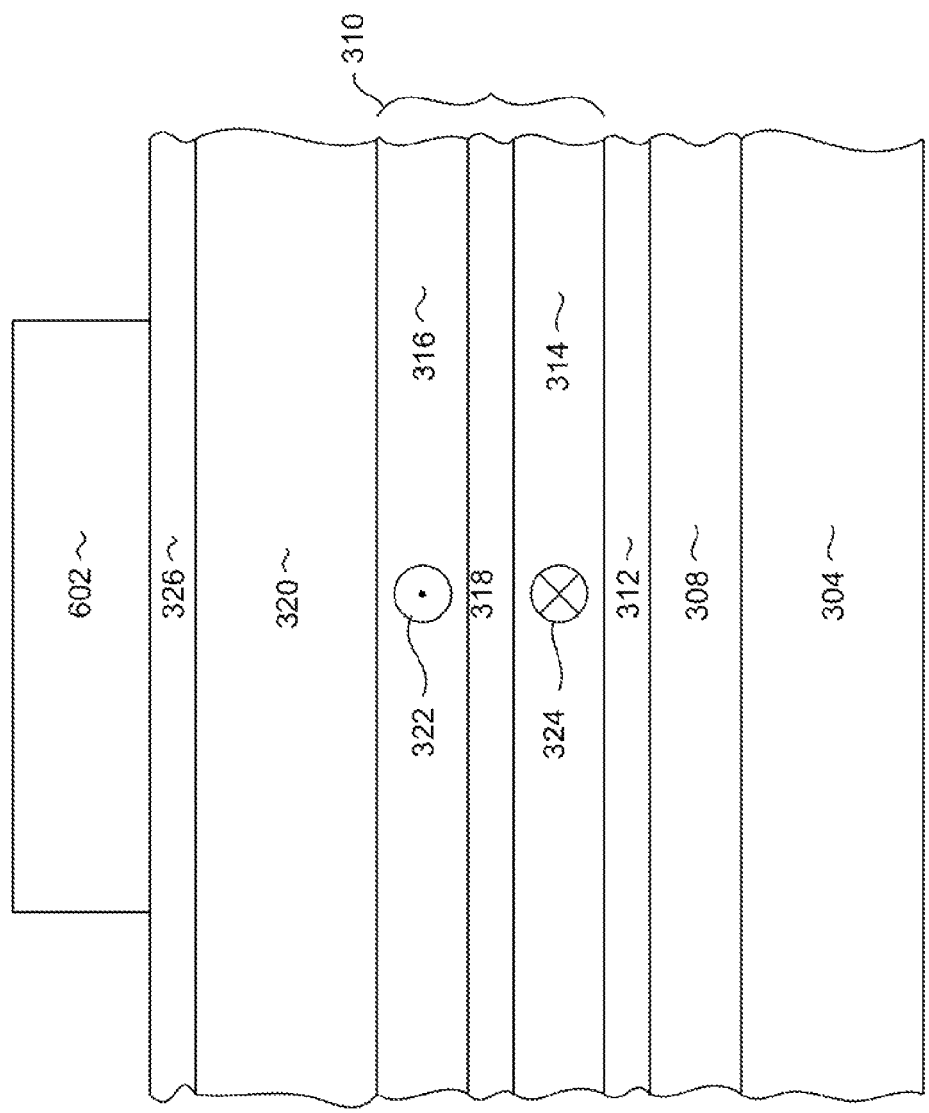

With reference now to FIG. 6, which shows a view from the direction of the ABS plane (as taken from line 6-6 of FIG. 4) a mask structure 602 is formed, having a width that is configured to define a width of the sensor. The masks structure can include a layer of photolithographically patterned and developed photoresist, and may also include other layers, such as but not limited to a bottom, antireflective coating (BARC), hard mask layer and an image transfer layer.

Figure 7:
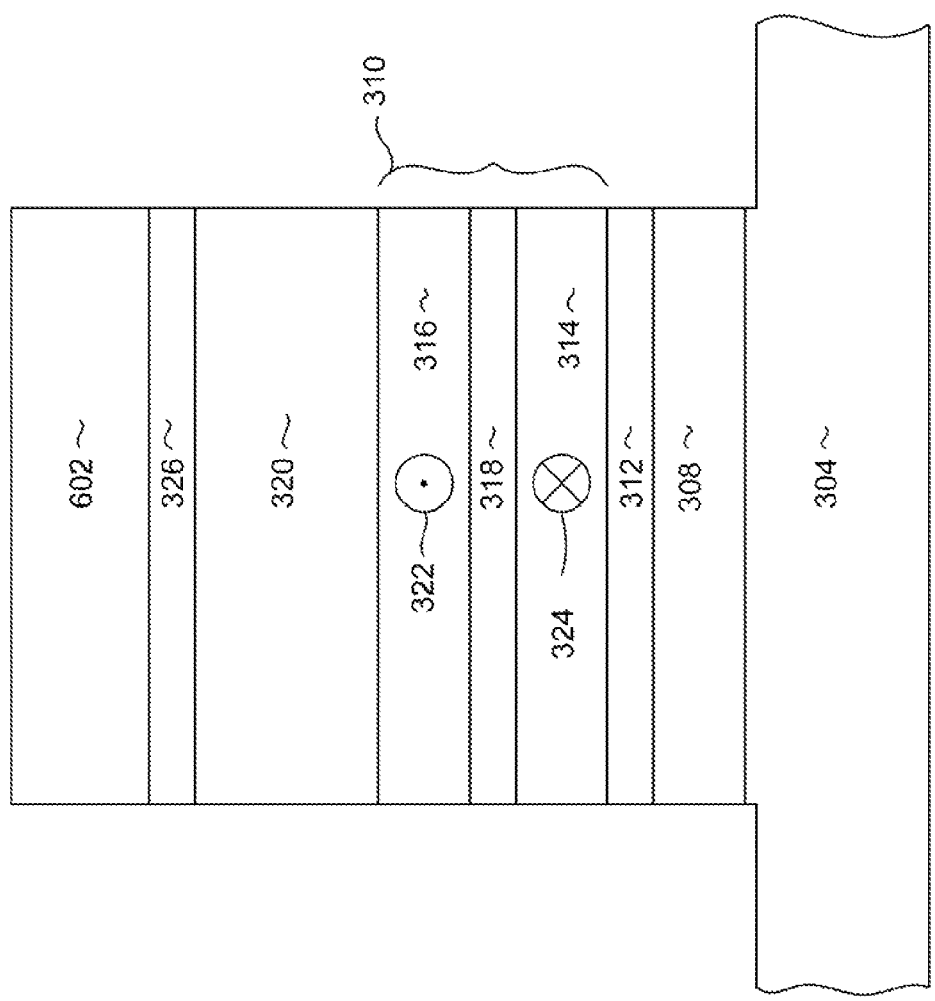
Figure 8:
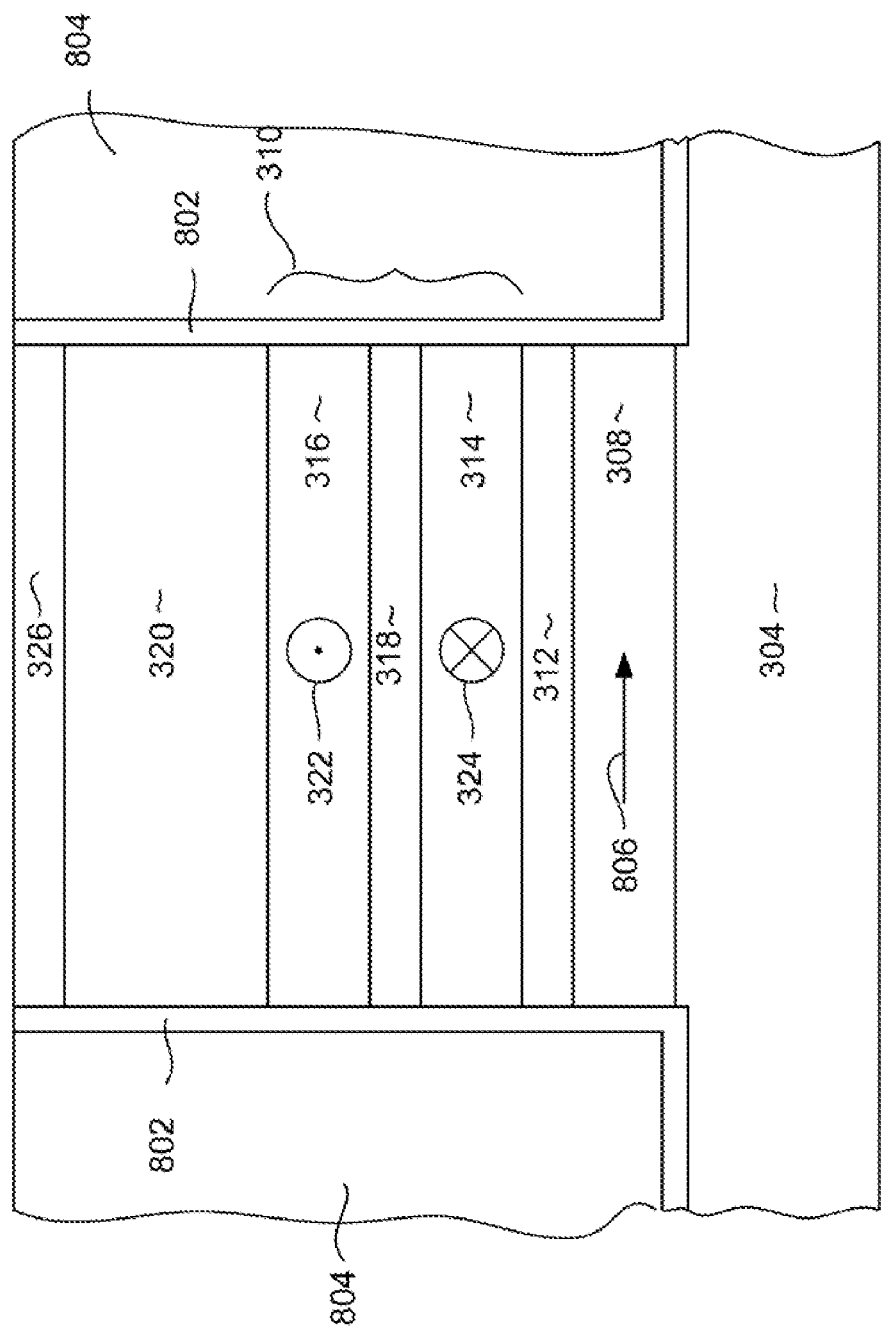

Then, with reference to FIG. 7, a material removal process such as ion milling is performed to remove portions of the sensor layers 308-326 that are not protected by the mask. This defines the width of the sensor. Then, with reference to FIG. 8, a thin layer of insulation 802 is deposited, followed by a hard magnetic material 804. The hard magnetic material 804 provides a hard bias layer for biasing a magnetization 806 of the free layer 308 in a direction parallel with the ABS as shown. After the insulation layer 802 and hard bias layer 804 have been deposited, the mask 602 (FIG. 7) can be lifted off, leaving the structure shown in FIG. 8.

Figure 9:
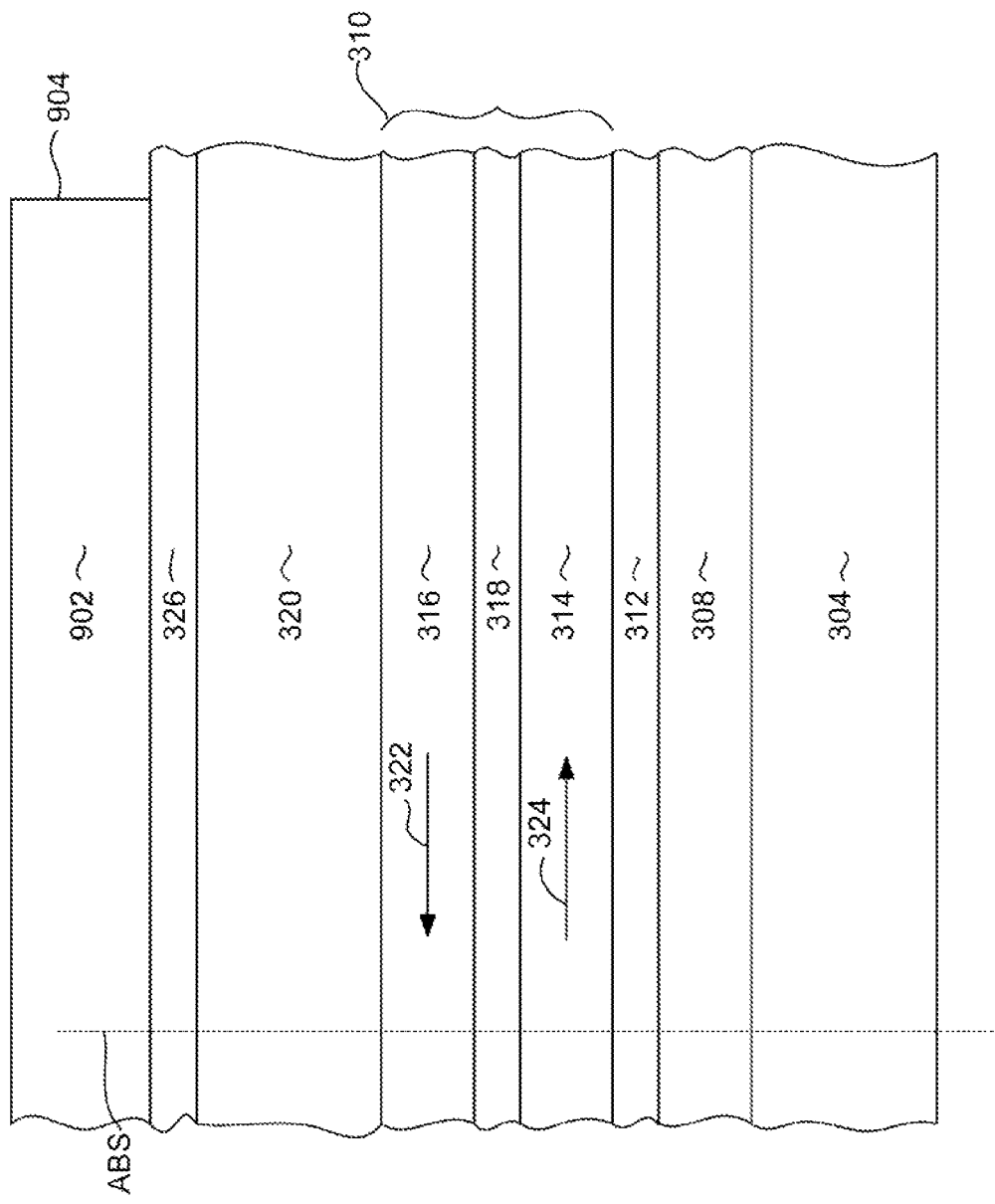
Figure 10:
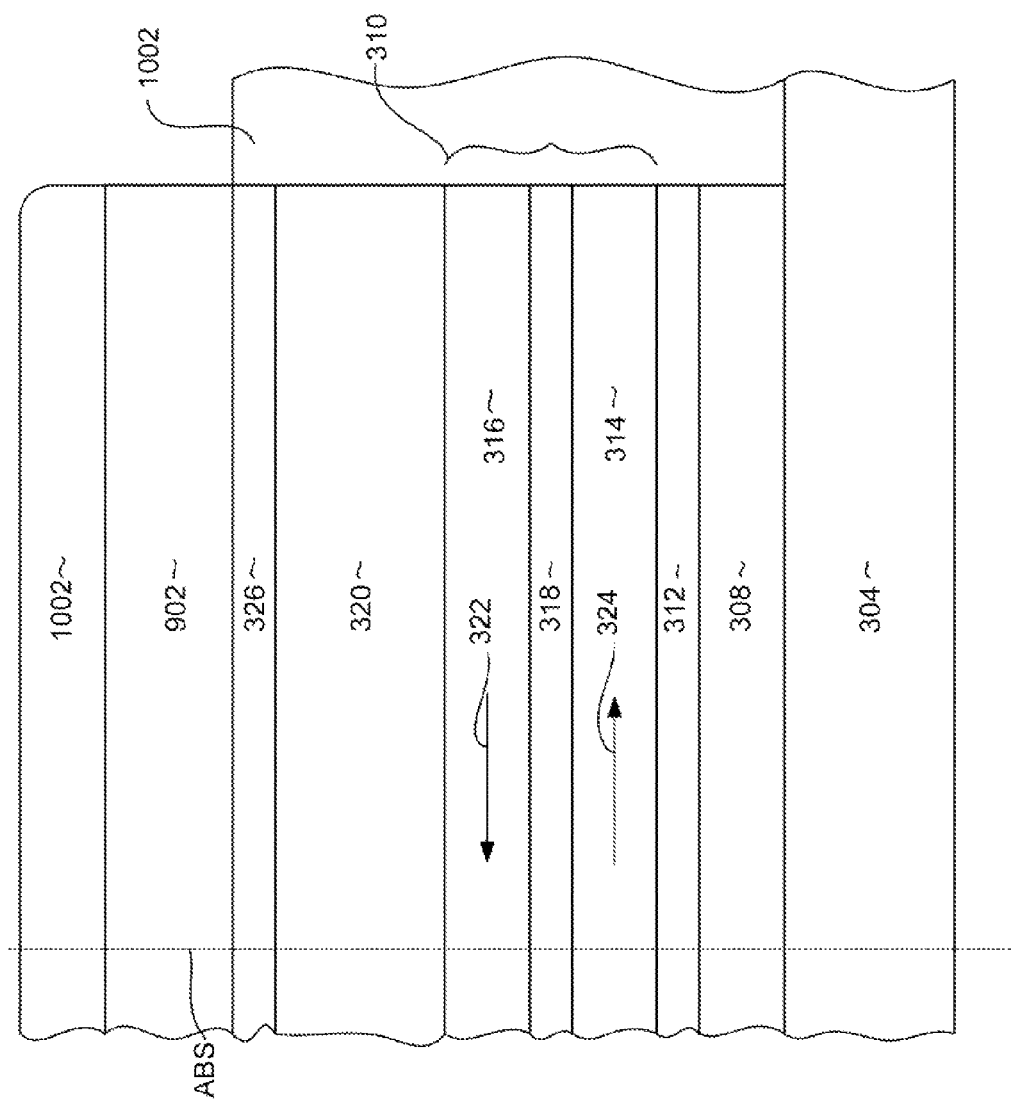

With reference now to FIG. 9, which shows a side cross sectional view, a second mask structure 902 is formed over the layers 304-326. This second mask structure has a back edge 904 that is located to define the back edge or stripe height of the sensor. With reference to FIG. 10, another material removal process such as ion milling is performed to remove material that is not protected by the mask 902, thereby defining the stripe height of the sensor. It should be pointed out that the order of the previously described masking and milling steps could be reversed so that the stripe height could be defined first, and then the track width. After the stripe height has been defined, a non-magnetic, electrically insulating fill material such as alumina 1002 can be deposited, and the mask 902 can then be lifted off.

Figure 11:
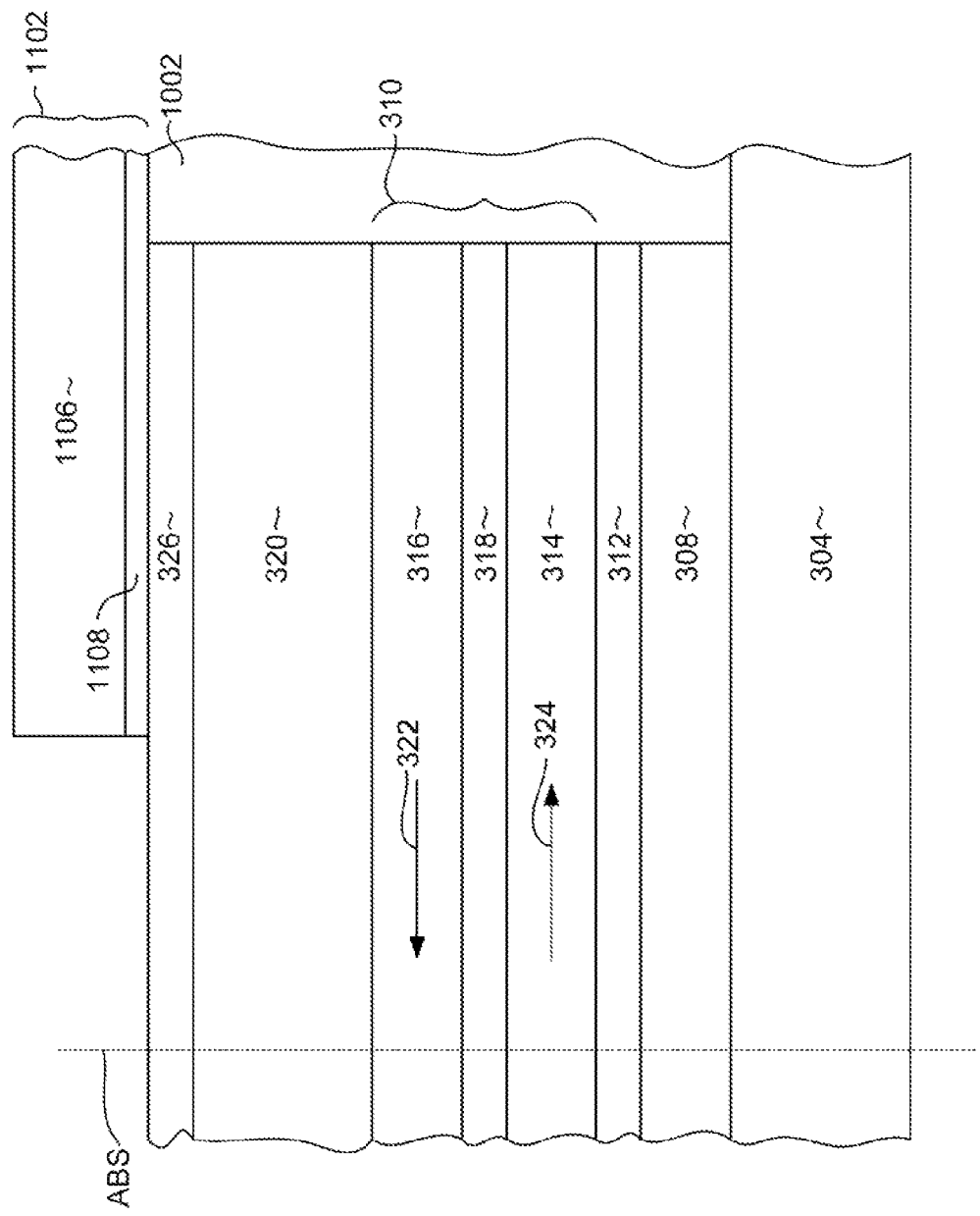
Figure 12:
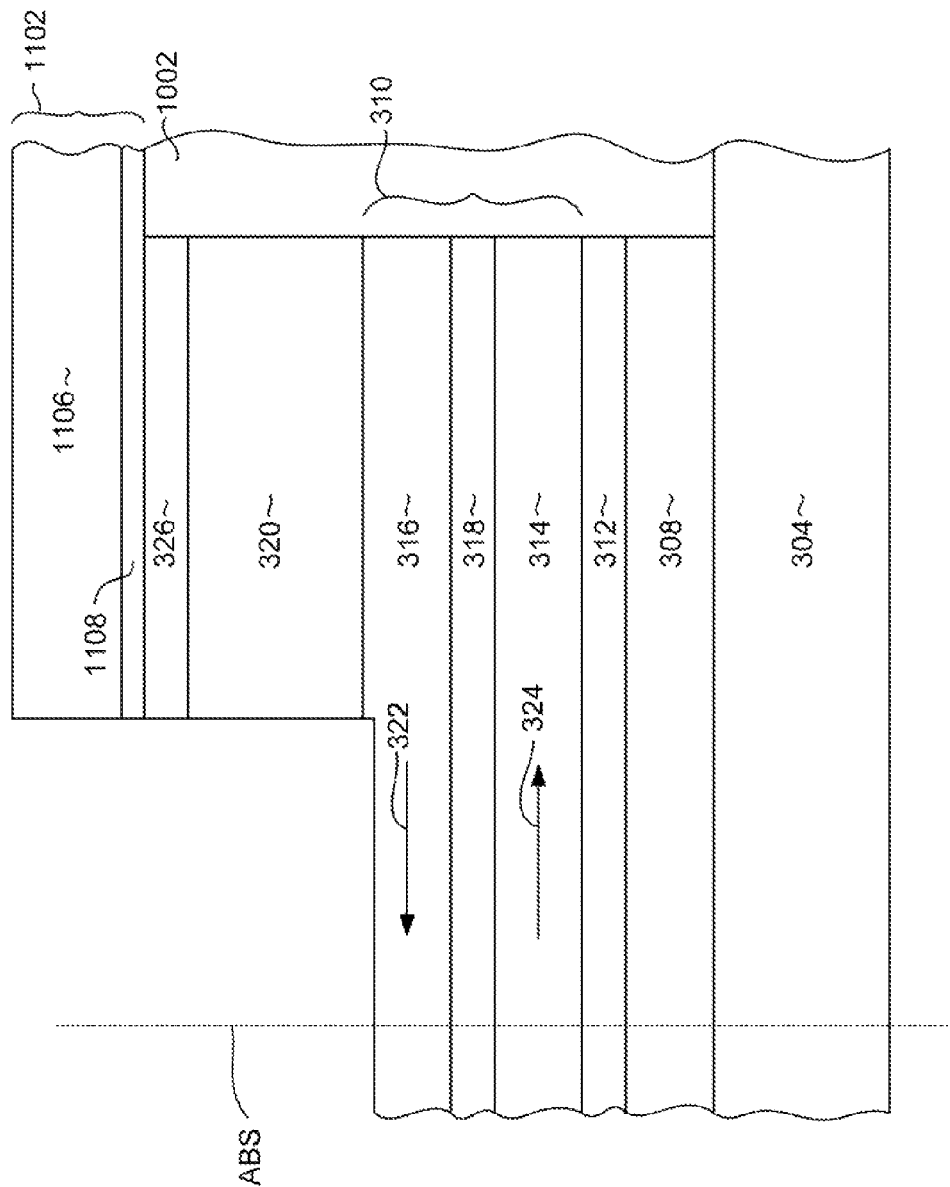

With reference now to FIG. 11, a third mask structure 1102 is formed, having a front edge 1104 that is recessed a desired distance from the intended ABS plane. The mask structure preferably includes a photolithographically patterned resist 1106 and a hard mask layer 1108 that can be a thin layer of alumina or some other material. With reference to FIG. 12, another material removal process is performed sufficiently to remove portions of the capping layer 322 and AFM layer 320 that are not protected by the mask 1102. This material removal process can be, for example, ion mil ling and an end point detection method such as Secondary Ion Mass Spectrometry (SIMS) can be performed to terminate the ion milling when the magnetic layer 316 of the pinned layer 310 has been reached. A small amount of the magnetic layer 316 can be removed during the ion milling.

Figure 13:
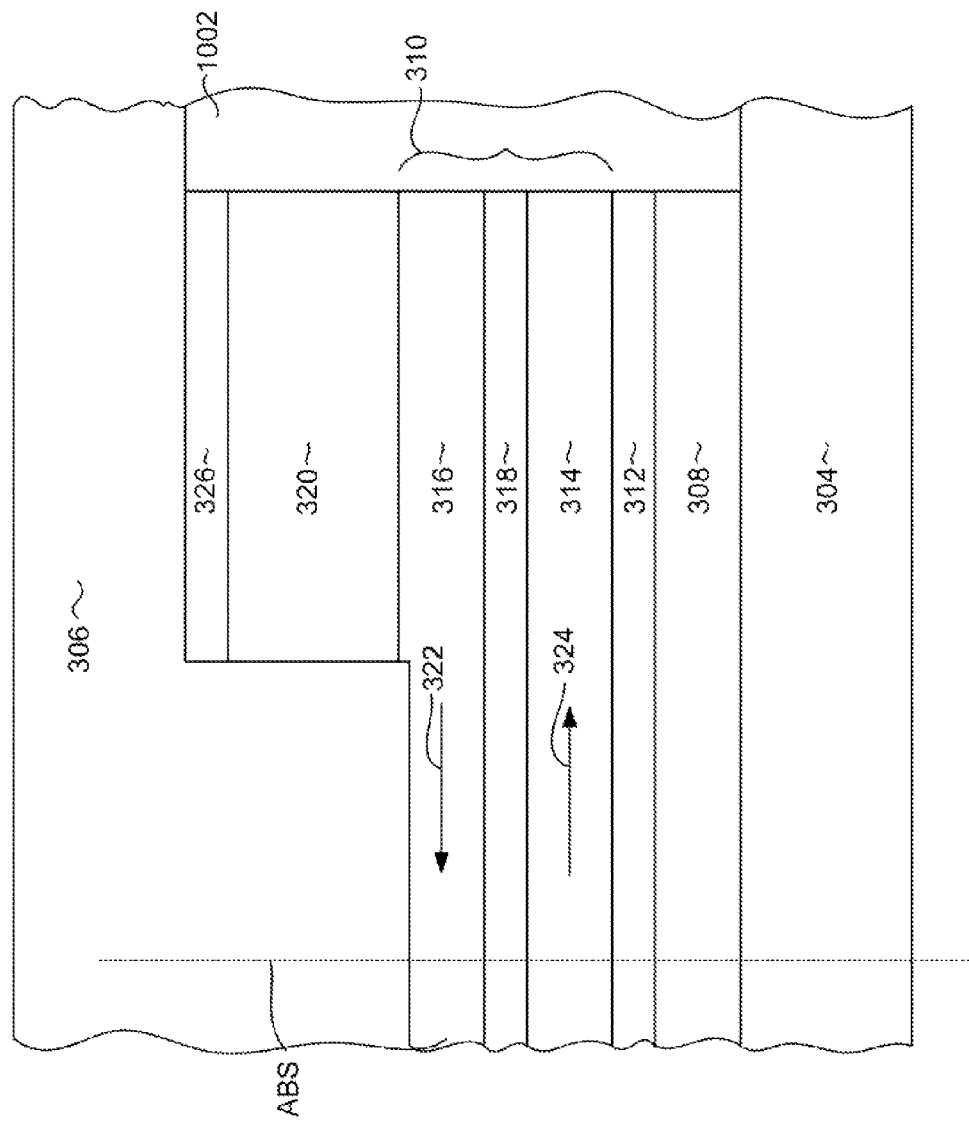

With reference now to FIG. 13, an electrically insulating, magnetic material such as NiFe or CoFe is deposited (such as by electroplating) to form an upper shield 306. A thin exchange breaking layer, such as a thin layer of Ta about 5 Angstroms thick (not shown) can be deposited, if necessary, before depositing the shield 306, in order to prevent exchange coupling between the magnetic layer 316 and the shield 306. However, this is optional. A lapping operation can be performed to remove material (from the left side as shown in FIG. 13) stopping at the intended ABS plane to form the air bearing surface of the sensor.

While various embodiments have been described above, it should be understood that they have been presented by way of example only and not limitation. Other embodiments falling within the scope of the invention may also become apparent to those skilled in the art. Thus, the breadth and scope of the invention should, not be limited by any of the above-described exemplary embodiments, but should be defined only in accordance with the following claims and their equivalents.

What is claimed is:

1. A current perpendicular to plane magnetoresistive sensor, comprising:
   a pinned layer structure having an end extending to an air bearing surface;
   a layer of antiferromagnetic material exchange coupled with a portion of the pinned layer structure that is recessed from the air bearing surface, the layer of antiferromagnetic material having a front edge that is recessed from the air bearing surface so that it does not extend to the air bearing surface; and
   an electrically conductive lead formed, over the pinned layer structure and the layer of antiferromagnetic material, the electrically conductive lead filling a space between the front air bearing surface and the front edge of the layer of antiferromagnetic material.

2. A magnetoresistive sensor as in claim 1 further comprising a capping layer formed over the layer of antiferromagnetic material between the layer of antiferromagnetic material and the electrically conductive lead.

3. A magnetoresistive sensor as in claim 1 further comprising a layer of Ta formed over the layer of antiferromagnetic material between the layer of antiferromagnetic material and the electrically conductive lead.

4. A magnetoresistive sensor as in claim 1 wherein the pinned layer structure extends from the air bearing surface to a back edge, the distance between the air bearing surface and the back edge defining a stripe height, and wherein the layer of distance between the back edge and the front edge of the layer of antiferromagnetic material is ¼ to ½ the stripe height.

5. A magnetoresistive sensor as in claim 1 wherein the electrically conductive lead comprises a magnetic material.

6. A magnetoresistive sensor as in claim 1 wherein the electrically conductive lead comprises NiFe or CoFe.

7. A magnetoresistive sensor as in claim 1 wherein the electrically conductive lead contacts the pinned layer in a region between the front edge of the layer of antiferromagnetic material and the air bearing surface.

8. A current perpendicular to plane magnetoresistive sensor, comprising:
   A sensor stack sandwiched between first and second electrically conductive, magnetic leads, the sensor stack including a magnetic tree layer, a magnetic pinned layer structure, a non-magnetic layer sandwiched between the free layer and the pinned layer structure and a layer of anti ferromagnetic material exchange coupled with a portion of the pinned layer structure; wherein
   the pinned layer structure is formed above the free layer structure;
   the layer of antiferromagnetic material has a front edge disposed toward and recessed from an air bearing surface;
   the second electrically conductive, magnetic lead extend over the front edge of the layer of anti ferromagnetic material to fill a space between the air bearing surface and the front edge of the layer of antiferromagnetic material.

9. A magnetoresistive sensor as in claim 8 wherein a distance between a lower surface of the free layer and an upper surface of the pinned layer structure defines a read gap of the magnetoresistive sensor.

10. A magnetoresistive sensor as in claim 8 wherein the second electrically conductive, magnetic lead contacts the pinned layer structure in the region between the front edge of the layer of antiferromagnetic material and the air bearing surface.

11. A magnetoresistive sensor as in claim 8 wherein the sensor stack further comprises a capping layer formed over the layer of antiferromagnetic material, opposite the pinned layer structure, and wherein the capping layer terminates at the front edge of the layer of antiferromagnetic material.

12. A magnetoresistive sensor as in claim 8 wherein the sensor stack further comprises a Ta layer formed over the layer of antiferromagnetic material, opposite the pinned layer structure, and wherein the capping layer terminates at the front edge of the layer of antiferromagnetic material.

13. A magnetoresistive sensor as in claim 8 further comprising a thin exchange blocking layer disposed between the pinned layer structure and the lead layer in a region between the front edge of the layer of antiferromagnetic material and the air beating surface.

14. A method for manufacturing a magnetoresistive sensor, comprising:
   depositing a free magnetic layer;
   depositing a non-magnetic layer over the free magnetic layer;
   depositing a pinned layer structure over the non-magnetic layer;
   depositing a layer of antiferromagnetic material over the pinned layer structure;
   depositing a capping layer over the layer of antiferromagnetic material;
   forming a mask structure over the capping layer, the mask layer having a front edge disposed toward, but recessed from an intended air bearing surface plane; and
   performing a material removal process to remove portions of the capping layer and layer of antiferromagnetic material that are not protected by the mask structure, the material removal process being terminated when the pinned layer structure has been reached, thereby exposing a portion of the pinned layer structure; and
   depositing an electrically conductive, magnetic material over the capping layer, layer of antiferromagnetic material and exposed portion of the pinned layer structure to form an electrically conductive, magnetic lead that fills a space between the layer of antiferromagnetic material and the intended air bearing surface plane.

15. A method as in claim 14 wherein the capping layer comprises Ta.

16. A method as in claim 14 wherein the forming a mask structure further comprises depositing a hard mask material, depositing a layer of photoresist and photolithographically patterning the photoresist.

17. A method as in claim 14 wherein the material removal process comprises ion milling.

18. A method as in claim 14 wherein the material removal process comprises ion milling, and wherein an end point detection method is used to determine when the pinned layer structure has been reached.

19. A method as in claim 14 wherein the material removal process comprises ion milling, and wherein Secondary Ion Mass Spectrometry is used to determine when the pinned layer structure has been reached.

20. A method as in claim 14 further comprising, after performing the material removal process and before depositing the magnetic, electrically conductive material an electrically conductive, magnetic lead, depositing a thin exchange blocking layer.

21. A method as in claim 14, further comprising before forming the mask structure, performing an annealing process to set a magnetization of the pinned layer structure.

* * * * *

UNITED STATES PATENT AND TRADEMARK OFFICE
CERTIFICATE OF CORRECTION

PATENT NO. : 7,961,440 B2
APPLICATION NO. : 11/863131
DATED : June 14, 2011
INVENTOR(S) : Gill et al.

It is certified that error appears in the above-identified patent and that said Letters Patent is hereby corrected as shown below:

In the claims:

col. 7, line 44, claim 8, please replace "tree" with --free--;
col. 7, line 47, claim 8, please replace "anti ferromagnetic" with --antiferromagnetic--;
col. 7, line 55, claim 8, please replace "anti ferromagnetic" with --antiferromagnetic--;
col. 8, line 15, claim 13, please replace "beating" with --bearing--.

Signed and Sealed this
Seventeenth Day of June, 2014

Michelle K. Lee
*Deputy Director of the United States Patent and Trademark Office*